United States Patent [19]
Bashir et al.

[11] Patent Number: 5,888,845
[45] Date of Patent: Mar. 30, 1999

[54] METHOD OF MAKING HIGH SENSITIVITY MICRO-MACHINED PRESSURE SENSORS AND ACOUSTIC TRANSDUCERS

[75] Inventors: Rashid Bashir, Santa Clara; Abul Kabir, Sunnyvale, both of Calif.

[73] Assignee: National Semiconductor Corporation, Santa Clara, Calif.

[21] Appl. No.: 643,091

[22] Filed: May 2, 1996

[51] Int. Cl.$^6$ .................................................. H01L 21/02
[52] U.S. Cl. ............................................................ 438/53
[58] Field of Search ............................ 216/2; 156/628.1, 156/657.1; 437/7, 228; 438/53

[56] References Cited

U.S. PATENT DOCUMENTS

| | | | |
|---|---|---|---|
| 5,146,435 | 9/1992 | Bernstein | 367/181 |
| 5,332,469 | 7/1994 | Mastrangelo | 156/643 |
| 5,343,064 | 8/1994 | Spangler et al. | 257/350 |
| 5,393,375 | 2/1995 | MacDonald et al. | 156/643 |

OTHER PUBLICATIONS

Scheeper et al., "Fabrication of Silicon Condenser Microphones using Single Wafer Technology," J. Micromechanical Systems, vol. 1, No. 3, pp. 147–154 (IEEE 1992) Sep. 1992.

Bernstein, J. et al., "Advanced Micromachined Condenser Hydrophone," pp. 73–76, Solid–State Sensor & Actuator Workshop, Hilton Head, South Carolina, Jun. 13–16, 1994.

Scheeper, P. R. et al., "Fabrication of Silicon Condenser Microphones using Single Wafer Technology," *Journal of Microelectromechanical Systems*, vol. 1, No. 3, Sep. 1992, pp. 147–154, (IEEE 1992).

Bergqvist, J. et al., "Capacitive Microphone with a Surface Micromachined Backplate Using Electroplating Technology," *Journal of Microelectromechanical Systems*, vol. 3, No. 2, Jun. 1994, pp. 69–76 (IEEE 1994).

Shajii, J. et al., "A Microfabricated Floating–Element Shear Stress Sensor Using Wafer–Bonding Technology," *Journal of Microelectromechanical Systems*, (IEEE 1992) pp. 89–94.

Howe, R. T. et al., "Silicon Micromechanics: Sensors and Actuators on a Chip," *IEEE Spectrum*, pp. 29–35 (Jul. 1990).

*Primary Examiner*—Thi Dang
*Assistant Examiner*—Alva C Powell
*Attorney, Agent, or Firm*—Limbach & Limbach LLP

[57] ABSTRACT

A method of making a pressure sensor or acoustic transducer having high sensitivity and reduced size. A thin sensing diaphragm is produced by growing a single crystal, highly doped silicon layer on a substrate using a chemical vapor deposition process. The diaphragm is incorporated into a pressure sensor or acoustic transducer which detects pressure variations by a change in the capacitance of a capacitor which includes the diaphragm as a movable member. The thin diaphragm produces a highly sensitive device which can be fabricated in a smaller size than sensors or transducers having thicker diaphragms.

13 Claims, 7 Drawing Sheets

METHOD OF MAKING HIGH SENSITIVITY MICRO-MACHINED PRESSURE SENSORS AND ACOUSTIC TRANSDUCERS

TECHNICAL FIELD

The present invention relates to pressure sensors and acoustic transducers used for microphones and other acoustic wave sensing devices, and more specifically, to a method of making highly sensitive and compact forms of such devices.

BACKGROUND OF THE INVENTION

Pressure sensors are used to detect variations in the pressure exerted on a surface or to measure the absolute value of the pressure exerted, and to convert the measured quantity into an electrical signal. A common use of such sensors is in the form of an acoustic transducer. Acoustic transducers detect changes in the pressure applied by sound waves and convert such changes into a varying electrical signal. Acoustic transducers may also be used in a reverse sense to convert electrical signals to pressure waves. When connected to an amplifier which drives a second transducer which reproduces the applied sound wave, an acoustic transducer can be made to function as a microphone.

One common type of acoustic transducer utilizes a diaphragm which moves in response to an applied sound wave. The diaphragm forms one plate of a two-plate capacitor. The movement of the diaphragm changes the separation of the capacitor plates, causing a variation in the capacitance of the capacitor. When used in conjunction with the appropriate circuitry, the change in capacitance produces an electrical signal which is proportional to the applied pressure. It is well known that the sensitivity of such a pressure sensor increases with a decrease in the thickness of the diaphragm. This is because a thinner diaphragm has less inertia and can respond more rapidly to small pressure variations. In addition, because the size of the transducer scales with the thickness of the diaphragm, reducing the thickness of the diaphragm leads to both a more sensitive and a smaller device.

Figure 1:
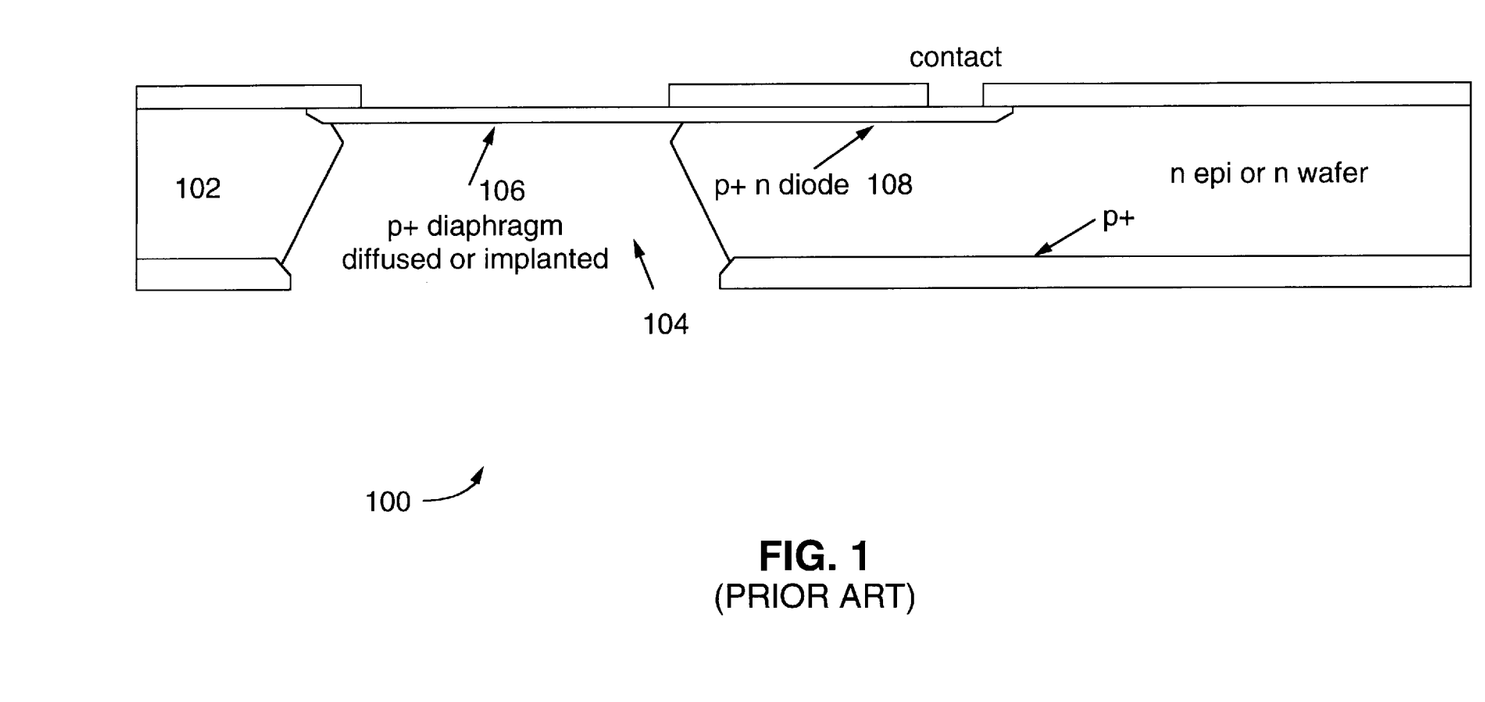
FIG. 1 is a side view of a prior art micromachined pressure sensor or acoustic transducer formed by processing techniques used in the semiconductor industry.

FIG. 1 is a side view of a prior art micro-machined pressure sensor or acoustic transducer 100 formed by processing techniques used in the semiconductor industry. As shown in the figure, transducer 100 is formed from a silicon substrate 102 into which is etched an aperture 104 for entrance of a pressure wave. The pressure wave impacts diaphragm 106, causing the diaphragm to move in response to variations in the pressure applied by the wave. Diaphragm 106 forms one plate of a two-plate capacitor. The second plate is formed by a perforated electrode (not shown) located above diaphragm 106. Movement of diaphragm 106 causes the capacitance of the two-plate capacitor to vary, producing a changing electrical signal.

There are two primary methods currently used in the semiconductor industry to fabricate diaphragm 106 for use in an acoustic transducer. The first method is based on the diffusion mechanisms which occur in boron gas phase doping processes. This method uses boron tri-chloride ($BCl_3$) as the source gas to produce a highly doped p+ layer which serves as an etch stop. While this method is capable of producing diaphragm films of thickness greater than one micron (1 $\mu$m), it has not proved useful in producing thinner films. This is because it has not been possible to reproducibly grow highly doped films of thickness less than one micron in this manner.

The second method used for producing diaphragms of the type shown in FIG. 1 is to implant Boron ions into a thin film. The use of such a method in fabricating a differential pressure sensor is discussed in U.S. Pat. No. 5,332,469, entitled "Capacitive Surface Micromachined Differential Pressure Sensor", issued Jul. 26, 1994. However, such a method of forming the diaphragm is not useful for fabricating very thin diaphragms because implantation of the Boron ions produces stress in the film which causes buckling and cracking of the diaphragm.

Thus, both of the currently used methods for making diaphragms for pressure sensors and acoustic transducers are incapable of reliably producing diaphragms having a thickness less than one micron. As a result, the methods cannot be used to produce pressure sensors or acoustic transducers which have increased sensitivity and reduced size compared to currently available devices. Another disadvantage of the two currently used methods for forming the sensor diaphragm is that they result in the formation of a parasitic reverse biased p+ n diode (element 108 of FIG. 1) which acts to electrically isolate diaphragm 106 from substrate 102. This increases the power required to operate the device and reduces the responsivity of the two-plate capacitor, making the sensor less sensitive.

What is desired is a method for producing pressure sensors and acoustic transducers having a high sensitivity and reduced size which overcomes the disadvantages of currently used techniques.

SUMMARY OF THE INVENTION

The present invention is directed to a method of making a pressure sensor or acoustic transducer having high sensitivity and reduced size. The method is based on forming a thin sensing diaphragm by growing a single crystal, highly doped silicon layer on a substrate using a chemical vapor deposition process. The diaphragm is incorporated into a pressure sensor or acoustic transducer which detects pressure variations by a change in the capacitance of a capacitor which includes the diaphragm as a movable member. The thin diaphragm produces a highly sensitive transducer which can be incorporated into a smaller size device than transducers having thicker diaphragms.

Further objects and advantages of the present invention will become apparent from the following detailed description and accompanying drawings.

DETAILED DESCRIPTION OF THE PREFERRED EMBODIMENT

As indicated when discussing the prior art acoustic transducer of FIG. 1, it is desirable to make the diaphragm of the sensor as thin as possible in such devices. This accomplishes two purposes: (1) it increase the sensitivity of the device; and (2) it allows the device to be scaled down in size, thereby producing a smaller device. However, present methods of fabricating thin diaphragms have the disadvantages noted. The inventors of the present invention have overcome these disadvantages by the process flow which will now be described. The result is a highly sensitive pressure sensor or acoustic transducer which can be scaled down to smaller sizes than currently available devices.

Figure 2:
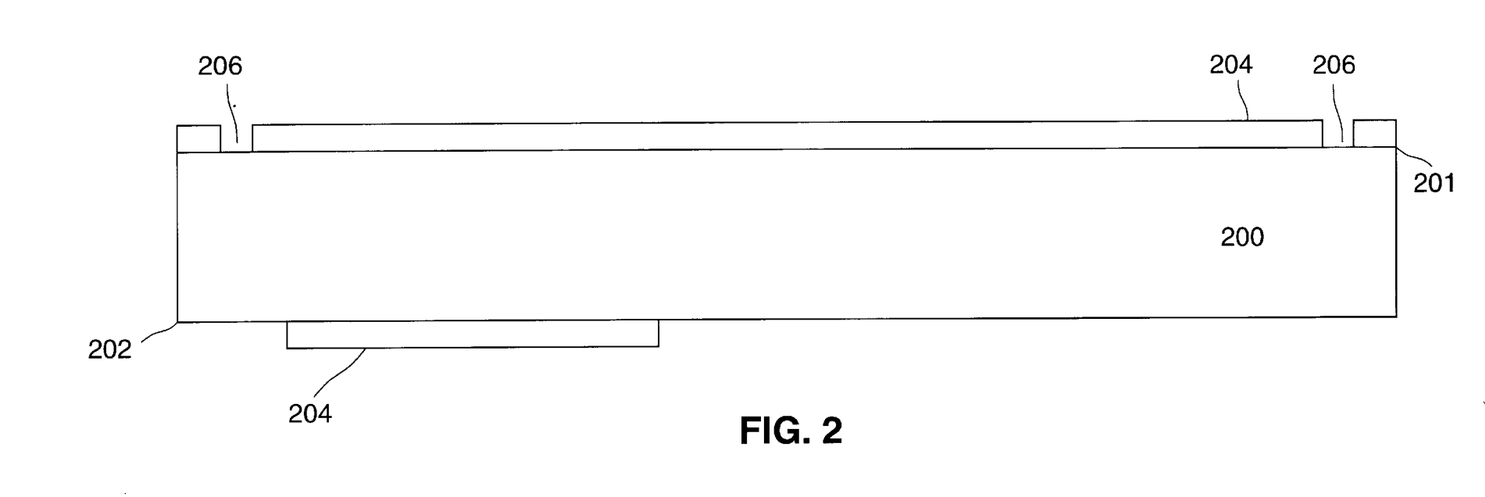
FIGS. 2 through 7 show the process flow for fabricating a thin diaphragm for use in a pressure sensor or acoustic transducer in accordance with the present invention, using processing techniques used in the semiconductor industry.

FIGS. 2 through 7 show the process flow for fabricating a thin diaphragm for use in a pressure sensor or acoustic transducer in accordance with the present invention. As shown in FIG. 2, fabrication of the pressure sensor or acoustic transducer begins with a silicon substrate 200. Typically, substrate 200 is composed of N or P-type silicon having a <100> crystal orientation, and a resistivity of 5 to 10 ohm-cm. If substrate 200 is P-type, then the diaphragm is formed in an N well. Substrate 200 may be double polished to produce the proper surface for the later processing steps. A 0.6 to 1 micron thick layer of field oxide 204 is grown on the top 201 and bottom 202 sides of substrate 200.

Using standard photolithographic techniques known in the semiconductor industry, a photoresist mask is used to pattern field oxide layer 204 on top side 201 of substrate 200. A wet oxide etch process based on a BHF chemistry is used to remove portions of field oxide layer 204, producing the oxide pattern shown in FIG. 2. It is noted that bottom side 202 of substrate 200 is protected during the oxide layer etch on top side 201 of the substrate. Regions 206 where the oxide has been removed from top side 201 will be processed further to form the locations for the device contacts.

After etching the oxide layer on the top of substrate 200, similar photolithographic techniques are used to pattern field oxide layer 204 on bottom side 202 of substrate 200. A wet oxide etch process based on a BHF chemistry is used to remove portions of field oxide layer 204, producing the oxide pattern shown in FIG. 2. It is noted that top side 201 of substrate 200 is protected during the etch of the oxide layer on bottom side 202 of the substrate. The result of the two oxide etch steps is the structure shown in FIG. 2.

Figure 3:
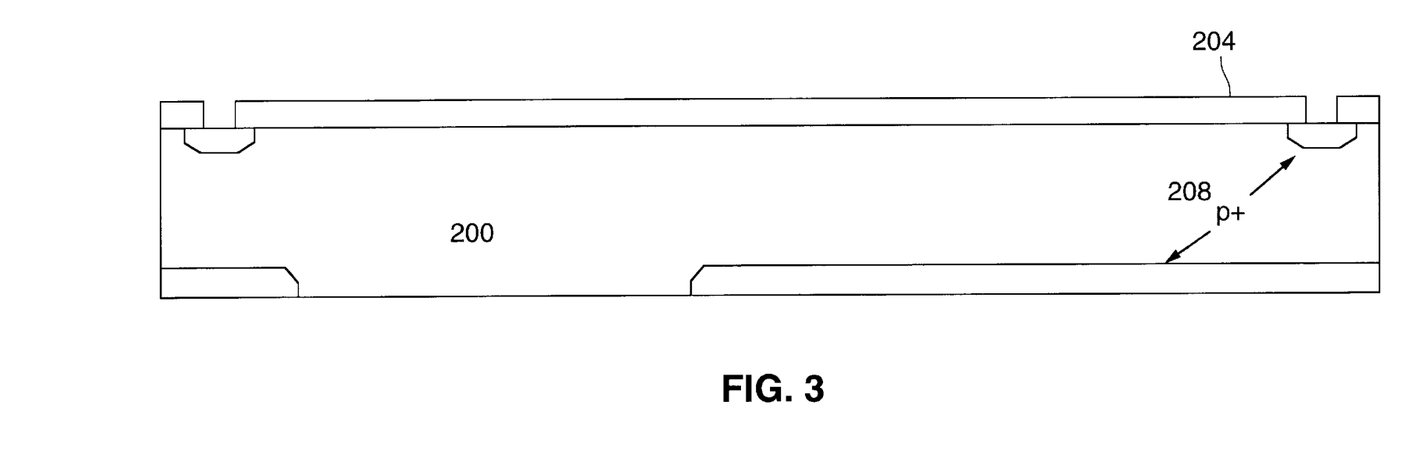

Next, a deep Boron diffusion process is carried out using Boron Nitride or $BCl_3$, at a temperature of 100° to 1150° C. This produces a deep p+ Boron diffusion region 208 in regions 206 and the uncovered portions of bottom side 202 of substrate 200. A photoresist layer (not shown) is then spun onto top side 201 of substrate 200. This serves to protect top side 201 during the subsequent steps. An etch process is then carried out to remove the remaining field oxide 204 on bottom side 202 of substrate 200. The photoresist layer previously deposited onto top side 201 of substrate 200 is then removed. The resulting structure is shown in FIG. 3.

Figure 4:
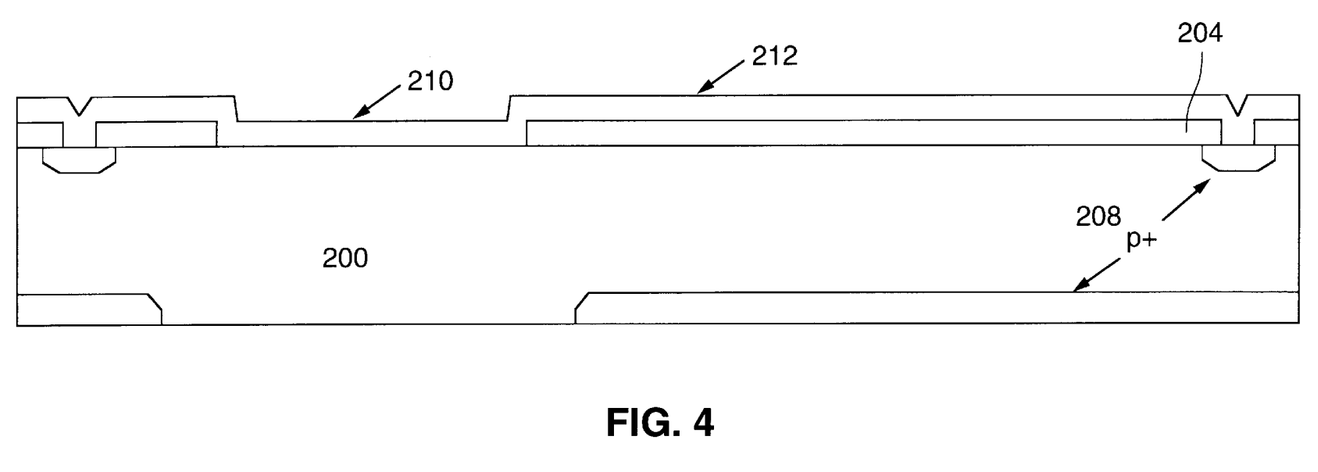

A mask is then used to pattern oxide layer 204 on top side 201 of substrate 200, followed by the removal of that portion of oxide layer 204 covering the substrate where the diaphragm will be formed. As shown in FIG. 4, a silicon or silicon-germanium layer (elements 210 and 212) is then deposited on top side 201 of substrate 200. The deposited layer is used to form a thin, highly doped p+ layer which will serve as the diaphragm for the pressure sensor or transducer. The silicon or silicon-germanium layer can be grown in a suitable single wafer epitaxial deposition (chemical vapor deposition) tool, such as an ASM Epsilon E2 Reactor, manufactured by ASM of Phoenix, Ariz.

The silicon or silicon-germanium layer is doped with Boron ions to a concentration of $1 \times 10^{20}$ ions/cm$^3$, using $B_2H_6$ as a Boron source gas and $SiH_4$ or $SiH_2Cl_2$ as a silicon source gas. The deposition process is optimized to cause a layer composed of single crystal silicon 210 to be grown on the regions of substrate 200 not covered by field oxide 204, while a layer of polysilicon 212 is grown on the regions covered by field oxide 204. Polysilicon layer 212 will be used to provide an electrical contact to the diaphragm formed from single crystal silicon layer 210. Thus, a single process step permits the formation of both the thin diaphragm and a contact to that layer. This reduces the complexity of the process flow used to form the contact, which typically requires additional step(s) devoted to formation of a contact layer. The deposition tool allows control of the thickness of layer 210, producing a diaphragm having a thickness of between 0.02 to 1 microns.

As mentioned, highly doped p+ layer, which will be used as the diaphragm, can be composed of silicon or silicon-germanium. If silicon-germanium is used, the strain in the deposited film layer can be tailored by altering the germanium content of the film. This permits the responsivity of the diaphragm to the applied pressure to be modified, and assists in controlling the buckling of the diaphragm. In addition, the heavy doping of the diaphragm layer causes the layer to act as an etch stop for the etching of the backside edge of the substrate (used to form an aperture to allow the pressure wave impact the diaphragm). This combination of processes allows precise control of the thickness of the diaphragm.

Figure 5:
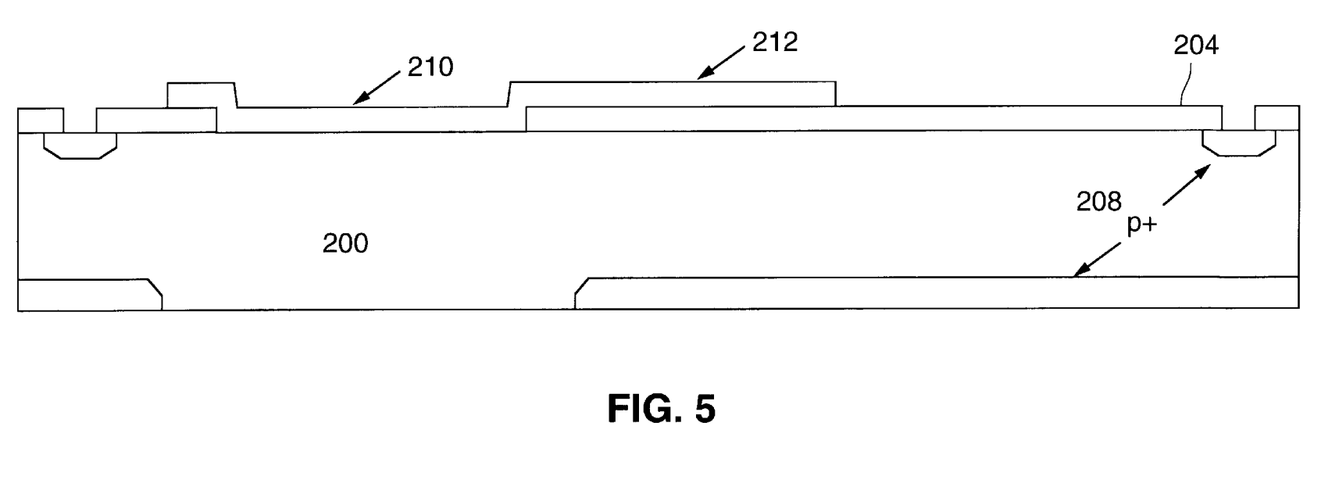

A photolithographic mask is then used to define the desired extent of polysilicon layer 212. The remaining portion of layer 212 is removed using a reactive ion etch (RIE) process in a Triode reactor using a $Cl_2$ based chemistry. The resulting structure is shown in FIG. 5. Polysilicon layer 212 will be used to form an isolated contact to layer 210, which forms the sensor or transducer diaphragm.

Figure 6:
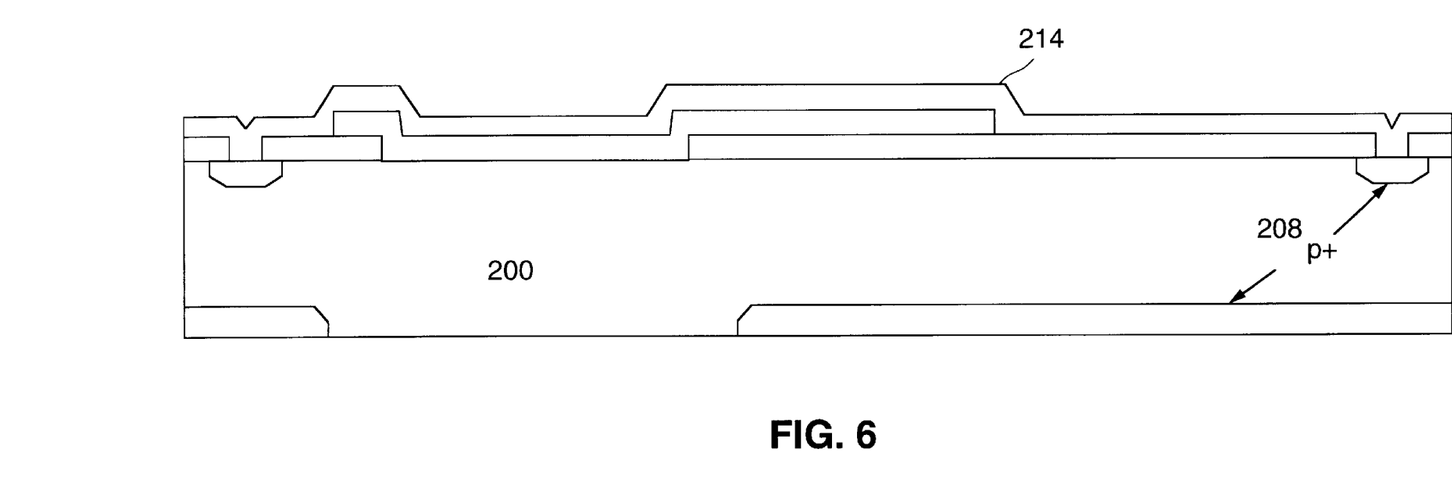

A layer of low temperature oxide (LTO) 214 is then deposited on top of substrate 200. LTO layer 214 is 0.25 to 0.7 microns thick and is deposited by means of a chemical vapor deposition process. The resulting structure is shown in FIG. 6.

Figure 7:
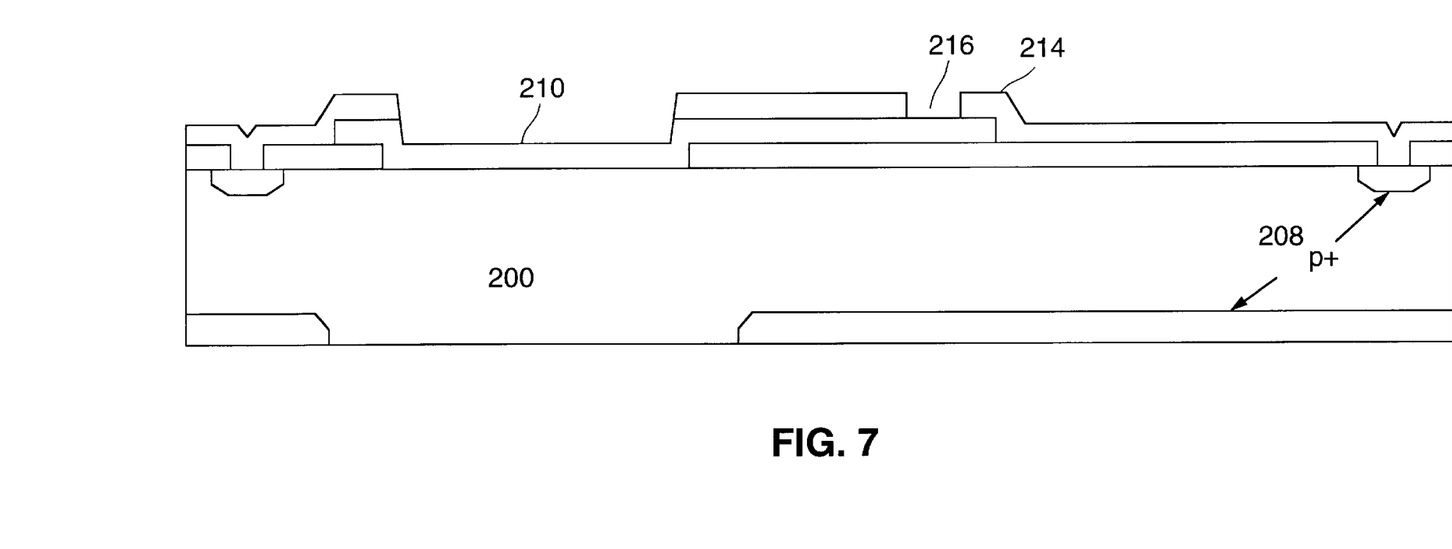

A photolithographic mask is then used to define the portions of LTO layer 214 corresponding to contact region 216 and single crystal region 210. Those portions of LTO layer 214 are removed using a wet etch process based on a BHF chemistry. The resulting structure is shown in FIG. 7. As noted, contact region 216 will be used to form an electrical contact to the diaphragm of the sensor.

The process flow up to this point has produced a thin, highly doped single crystal silicon or silicon-germanium layer which serves as a sensor diaphragm. This structure may then be subjected to further processing to produce a pressure sensor or acoustic transducer. If it is desired to produce a pressure sensor, the backside of substrate 200 must be etched to provide an aperture for entry of the pressure wave. Substrate 200 may be etched from the backside by using a mask and an EDP etch process performed at approximately 105° C. A KOH or TMAH based etch may also be used. The highly doped p+ regions 208 will not be etched, while the lower doped regions will be removed by the etch process. The pressure sensor is then completed by forming a second contact to the device. This contact may be formed by bonding a second silicon substrate on top of the structure of FIG. 7. As diaphragm 210 of the sensor moves in response to an impacting pressure wave, it will alter the separation of the capacitor plates of the capacitor formed by the diaphragm and the second substrate. This will alter the capacitance of the capacitor, permitting sensing of the pressure wave. Another method of forming the second contact is to follow the process flow for forming the metal seed layer or perforated electrode, which will be discussed with reference to FIGS. 11 and 12. Other methods compatible with the described process flow may also be used. After formation of the second contact, the pressure sensor structure is packaged and tested.

It is noted that due to the existence of the polysilicon layer on top of the oxide layer, the backside etch used to form the aperture for entry of the pressure wave is not as sensitive to the alignment of the etch mask as is the case for process flows found in the art. This is because over-etching in the lateral direction is not an issue as it would be for alternative process flows. This means that the thickness and size of the diaphragm can be more precisely controlled, producing both a more sensitive and compact device. In order to make the aperture etch process sufficiently insensitive to the etch mask alignment, it is suggested that the thickness of oxide layer 204 be substantially greater (e.g., a factor of five or so) than that of sensor membrane 210.

Figure 8:
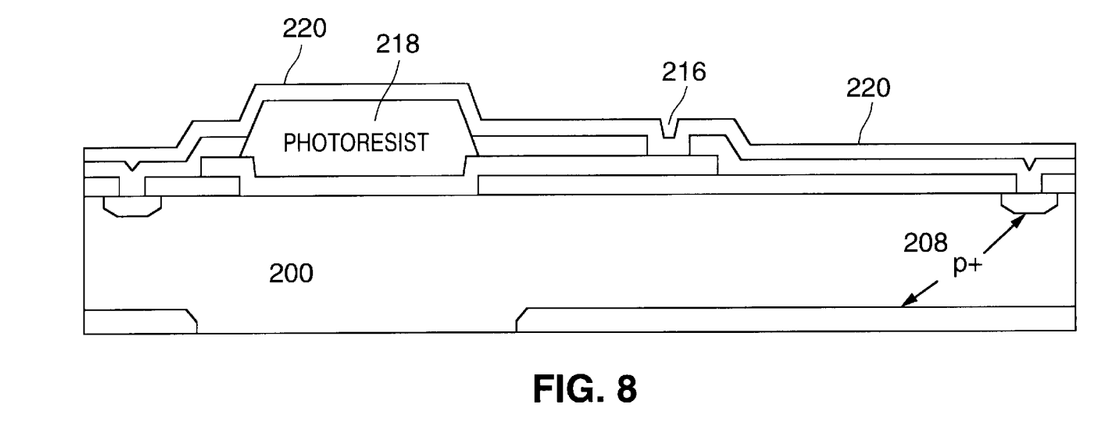
FIGS. 8 through 13 show the process flow for forming an acoustic transducer using the thin diaphragm produced according to the method of the present invention.

FIGS. 8 through 13 show the process flow for forming an acoustic transducer using the thin diaphragm produced according to the method of the present invention. Continuing the processing of the structure of FIG. 7, a sacrificial photoresist or low temperature film layer 218 is then deposited. This layer is patterned using photolithographic techniques. The photoresist layer is etched, producing the structure shown in FIG. 8. As shown in the figure, the photoresist or low temperature film remains over single crystal region 210. A metal seed layer 220 is then sputtered onto the top of substrate 200. Layer 220 is typically composed of a gold-nickel-vanadium alloy, a titanium-nickel alloy, or silver. The resulting structure is shown in FIG. 8. Metal seed layer 220 provides a base for formation of a second electrode for the transducer.

Figure 9:
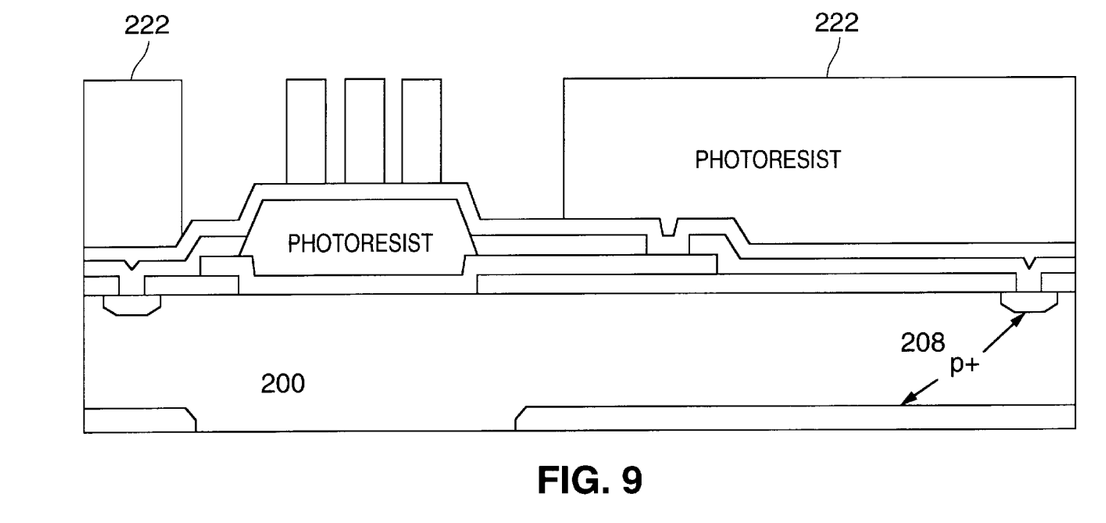

A photoresist layer 222 is then spun onto substrate 200. Layer 222 is deposited using multiple steps of spinning on the photoresist, until a thickness of approximately 25 microns is obtained. A photolithography mask is used to define the plating region used to form a backplate or perforated bridge electrode for the transducer. The photoresist layer is then selectively developed. The resulting structure is shown in FIG. 9.

Figure 10:
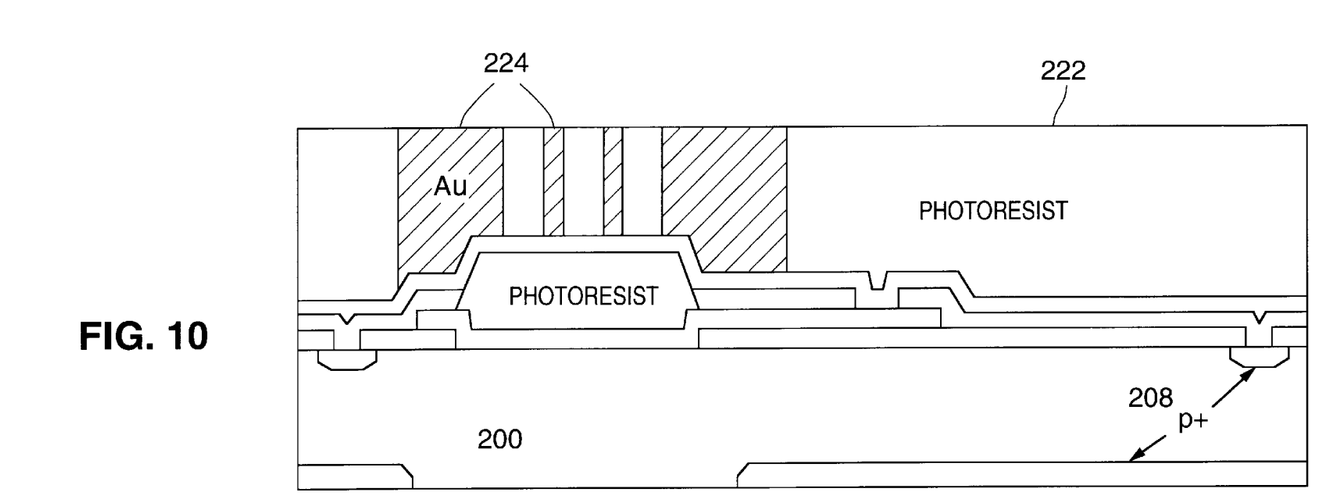

A layer of gold or silver 224 of thickness approximately equal to the thickness of photoresist layer 222 is then plated onto substrate 200, filling the portions of photoresist layer 222 removed during the previous process step. Layer 224 is typically applied by a pulsed plating process to a thickness of approximately 20 microns. The layer of gold or silver 224 will be used to form the perforated bridge electrode which acts as one plate of the two-plate capacitor. The resulting structure is shown in FIG. 10.

Figure 11:
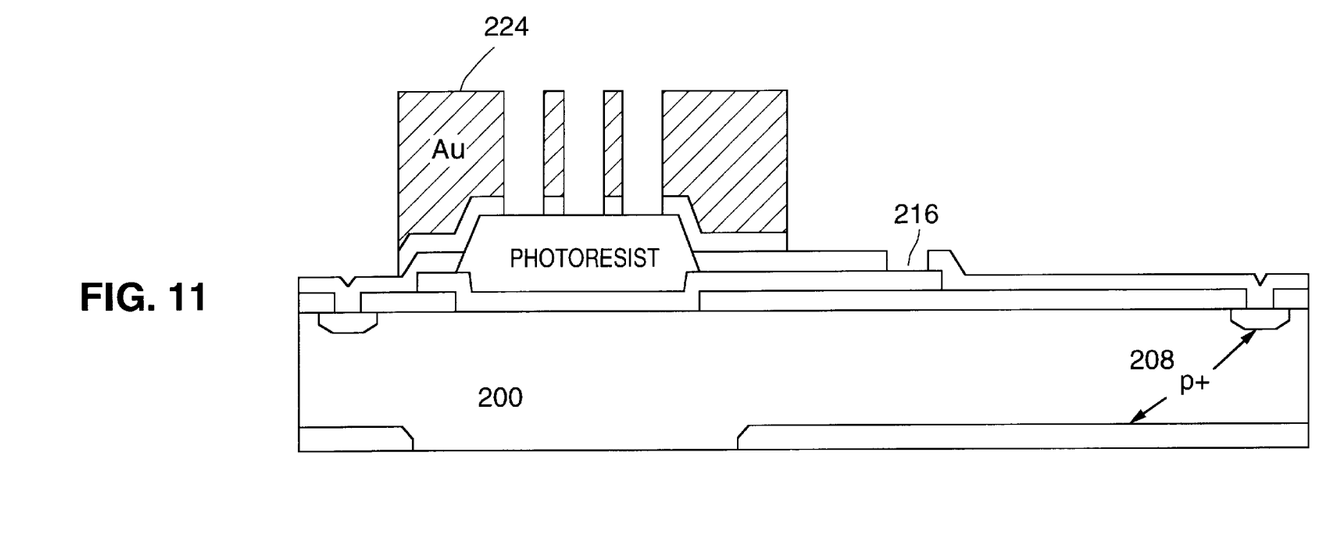

The remaining portions of photoresist layer 222 are then removed by a suitable resist removal solution. The portions of metal seed layer 220 not covered by gold or silver layer 224 are then removed by a wet etch based on a $HNO_3$/HF chemistry. The resulting structure is shown in FIG. 11.

Figure 12:
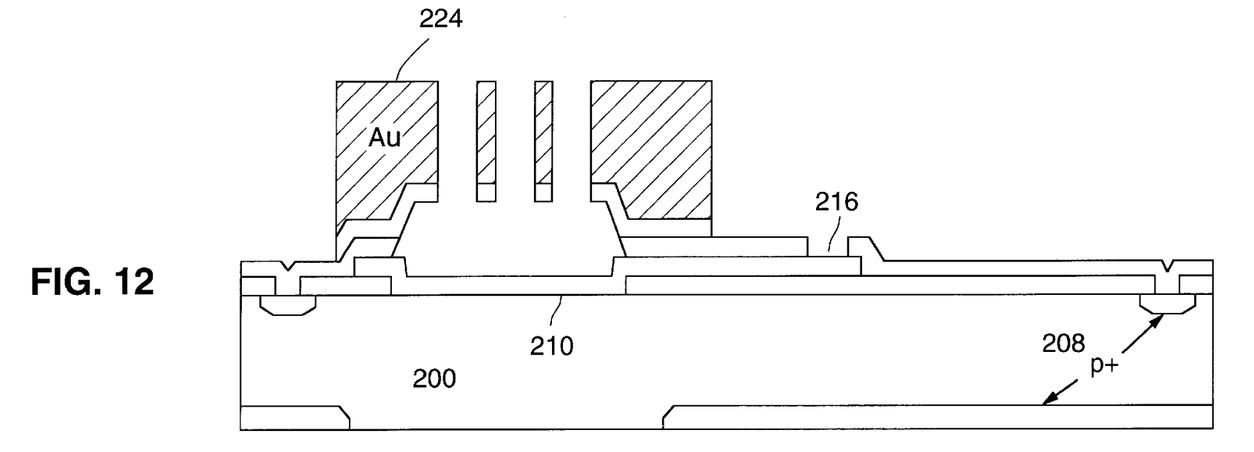

The sacrificial layer of photoresist or low temperature film 218 is then removed by a suitable resist removal solution. This produces an opening between single crystal layer 210 and gold or silver layer 224. The opening serves as the gap between the two plates of the capacitor formed from single crystal layer 210 and gold or silver layer 224. The resulting structure is shown in FIG. 12.

Figure 13:
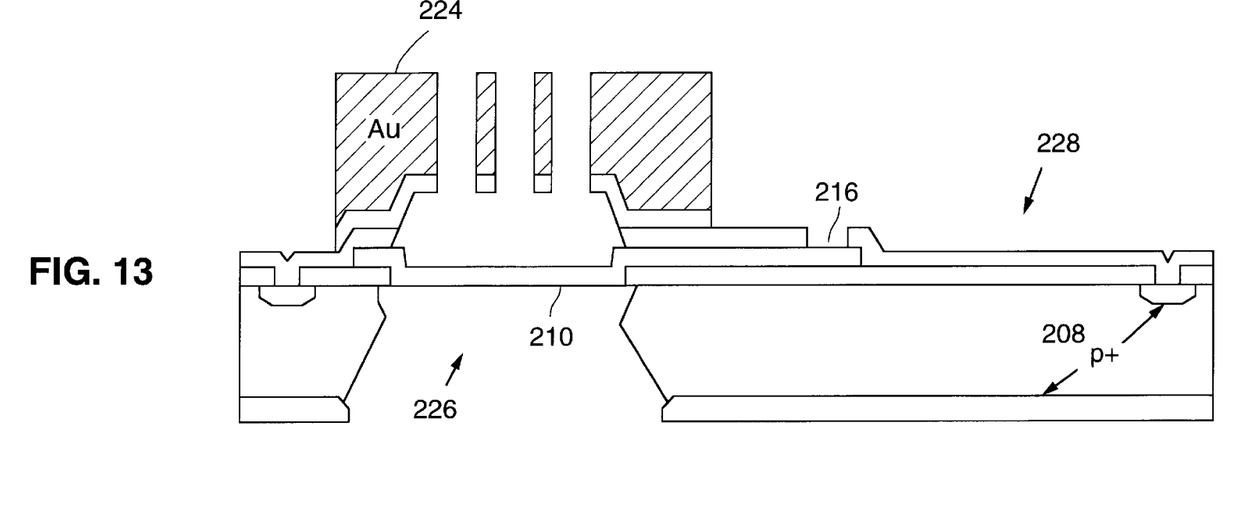

Substrate 200 is then etched from the backside to produce an aperture 226 which allows acoustic waves to enter the transducer and impact the diaphragm. The substrate etching is performed by an EDP etch process performed at approximately 105° C. A KOH or TMAH based etch process may also be used. The highly doped p+ regions 208 will not be etched, while the lower doped regions will be removed by the etch process. The resulting structure is shown in FIG. 13. The transducer structure is then packaged and tested.

As shown in FIG. 13, the acoustic transducer 228 of the present invention includes a thin diaphragm 210 formed from a highly doped layer of single crystal silicon. Acoustic pressure waves enter transducer 228 by means of aperture 226. The waves impact diaphragm 210, causing it to vibrate. This causes a displacement between the plates of a two-plate capacitor formed from diaphragm 210 and the perforated electrode composed of gold or silver layer 224. The displacement between the plates causes the capacitance to vary, producing a signal which can be measured. The change in capacitance is proportional to the magnitude of the applied pressure. Contact region 216 provides an isolated contact region on polysilicon layer 212 to diaphragm 210 of the sensor. The contact region may be used as is, or be further processed by depositing a metal layer to form a contact.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method of manufacturing an acoustic transducer, comprising:

depositing a layer of field oxide on a top surface of a substrate;

masking the field oxide layer to define a diaphragm region on the top surface of the substrate;

removing the field oxide from the diaphragm region;

growing a layer of single crystal silicon on the top surface of the substrate in the diaphragm region by means of a chemical vapor deposition (CVD) process;

growing a layer of polysilicon on the portions of the top surface of the substrate covered by the layer of field oxide; and etching a bottom surface of the substrate to remove a portion of the substrate between the bottom surface of the substrate and the single crystal silicon layer to form an aperture to allow a pressure wave to propagate from the bottom surface of the substrate to the single crystal silicon layer.

2. The method of claim 1, further comprising:

forming a contact to the single crystal silicon layer in the polysilicon layer.

3. The method of claim 1, further comprising the step of:

doping the layer of single crystal silicon to form an etch stop.

4. The method of claim 1, wherein the single crystal silicon layer is a silicon-germanium layer.

5. The method of claim 1, wherein a thickness of the field oxide layer is substantially greater than a thickness of the single crystal silicon layer, and the step of etching the bottom surface of the substrate to form an aperture further comprises:

using an etch mask to define the aperture, wherein alignment of the etch mask is non-critical.

6. The method of claim 1, further comprising the step of:

forming a perforated electrode above the single crystal silicon layer, the perforated electrode being electrically isolated from the single crystal silicon layer and separated from the single crystal silicon layer by a capacitor gap, thereby forming a two-plate capacitor comprised of the single crystal silicon layer and the perforated electrode.

7. The method of claim 7, wherein the step of forming the perforated electrode further comprises:

depositing a first sacrificial layer on the top surface of the substrate;

etching the first sacrificial layer to remove the portions of the first layer not covering the defined diaphragm region from the top surface of the substrate;

depositing a metal seed layer over the top surface of the substrate;

depositing a second sacrificial layer on the top surface of the substrate;

masking the second sacrificial layer to define a plating region for the formation of a bridge electrode;

depositing a layer of bridge electrode material in the defined bridge electrode region;

removing the remaining portion of the second sacrificial layer;

removing the portions of the metal seed layer not covered by the bridge electrode material; and removing the remaining portion of the first sacrificial layer.

8. The method of claim 7, wherein the metal seed layer is selected from the group consisting of a gold containing alloy, a titanium containing alloy, and silver.

9. The method of claim 7, wherein the bridge electrode material is selected from the group consisting of gold and silver.

10. A method of manufacturing a thin diaphragm for use in a pressure sensor or acoustic transducer, comprising:

depositing a layer of field oxide on a top surface of a substrate;

masking the field oxide layer to define a diaphragm region on the top surface of the substrate;

removing the field oxide from the diaphragm region;

growing a layer of single crystal silicon on the top surface of the substrate in the diaphragm region and a layer of polysilicon on the portions of the top surface of the substrate covered by the layer of field oxide by means of a chemical vapor deposition (CVD) process; and etching a bottom surface of the substrate to remove a portion of the substrate between the bottom surface of the substrate and the single crystal silicon layer, whereby an aperture is formed to allow a pressure wave to propagate from the bottom surface of the substrate to the single crystal silicon layer.

11. The method of claim 10, further comprising the step of:

forming a contact to the single crystal silicon layer in the polysilicon layer.

12. The method of claim 10, further comprising the step of:

doping the layer of single crystal silicon to form an etch stop.

13. The method of claim 10, wherein a thickness of the field oxide layer is substantially greater than a thickness of the single crystal silicon layer, and the step of etching the bottom surface of the substrate to form an aperture further comprises:

using an etch mask to define the aperture, wherein alignment of the etch mask is non-critical.

* * * * *